(12) United States Patent
Hung et al.

(10) Patent No.: US 7,948,750 B2
(45) Date of Patent: May 24, 2011

(54) PORTABLE ELECTRONIC DEVICE INCORPORATING EXTENDABLE THERMAL MODULE

(75) Inventors: Jui-Wen Hung, Taipei Hsien (TW); Nien-Tien Cheng, Taipei Hsien (TW); Ping-Yang Chuang, Taipei Hsien (TW)

(73) Assignee: Foxconn Technology Co., Ltd., Tu-Cheng, New Taipei (TW)

( * ) Notice: Subject to any disclaimer, the term of this patent is extended or adjusted under 35 U.S.C. 154(b) by 92 days.

(21) Appl. No.: 12/503,082

(22) Filed: Jul. 15, 2009

(65) Prior Publication Data

US 2010/0238628 A1    Sep. 23, 2010

(30) Foreign Application Priority Data

Mar. 21, 2009 (CN) .......................... 2009 1 0301009

(51) Int. Cl.
*G06F 1/20* (2006.01)
*H05K 7/20* (2006.01)

(52) U.S. Cl. ......... 361/679.47; 361/679.48; 361/679.52; 361/679.54; 361/679.55; 361/694; 361/695; 361/697; 361/700; 361/703; 361/704; 165/80.2; 165/80.3; 165/185; 174/15.2; 174/16.1; 174/16.3

(58) Field of Classification Search . 361/679.46–679.48, 679.52, 679.54–679.56, 361/694–695, 697, 700, 703–704, 709–710, 361/718–719; 165/80.2–80.3, 185; 174/15.2, 174/16.1, 16.3
See application file for complete search history.

(56) References Cited

U.S. PATENT DOCUMENTS

| | | | | |
|---|---|---|---|---|
| 5,808,869 A * | 9/1998 | Donahoe et al. | ............... | 361/704 |
| 5,862,037 A * | 1/1999 | Behl | ......................... | 361/679.49 |
| 5,898,568 A * | 4/1999 | Cheng | ........................... | 361/695 |
| 6,034,871 A * | 3/2000 | Cheng | ........................... | 361/695 |
| 6,058,009 A * | 5/2000 | Hood et al. | ............... | 361/679.47 |
| 6,104,607 A * | 8/2000 | Behl | ......................... | 361/679.49 |
| 6,188,573 B1 * | 2/2001 | Urita | ......................... | 361/679.48 |
| 6,657,859 B1 * | 12/2003 | Karr | ......................... | 361/679.33 |
| 6,724,626 B1 * | 4/2004 | Hodes et al. | .................. | 361/700 |
| 6,914,782 B2 * | 7/2005 | Ku | ................................. | 361/700 |
| 7,321,491 B2 * | 1/2008 | Long et al. | ............... | 361/679.48 |
| 7,532,470 B2 * | 5/2009 | Ariga | ........................... | 361/695 |
| 2005/0225942 A1 * | 10/2005 | Lee | ............................... | 361/700 |

FOREIGN PATENT DOCUMENTS

| | | | | |
|---|---|---|---|---|
| JP | 2000002493 A | * | 1/2000 | |
| JP | 2006107275 A | * | 4/2006 | |
| KR | 2006131452 A | * | 12/2006 | |

* cited by examiner

*Primary Examiner* — Jayprakash N Gandhi
*Assistant Examiner* — Robert J Hoffberg
(74) *Attorney, Agent, or Firm* — Frank R. Niranjan

(57) ABSTRACT

An electronic device includes a chassis, an electronic component, a heat sink having a base and a thermal module. The chassis includes a bottom plate and a side plate surrounding the bottom plate. A cutout is defined in the side plate. The electronic component is arranged on the bottom plate and faces the cutout of the side plate. The base of the heat sink is arranged on the electronic component, and the thermal module is arranged on the base of the heat sink. The thermal module is assembled onto the base by extending through the cutout and can be taken out of the chassis through the cutout. The thermal module and the heat sink together dissipate heat generated by the electronic component when the thermal module is inserted into the chassis.

18 Claims, 3 Drawing Sheets

PORTABLE ELECTRONIC DEVICE INCORPORATING EXTENDABLE THERMAL MODULE

BACKGROUND

1. Technical Field

The disclosure generally relates to portable electronic devices, and particularly to a portable electronic device having an extendable thermal module which can be assembled to/disassembled from the portable electronic device conveniently.

2. Description of Related Art

With the continuing development of electronic technology, processors of the electronic devices have become faster and faster, which causes the processors to generate more and more redundant heat. Thermal modules are traditionally disposed in the electronic devices to transfer heat of the processors to an outside, thus to maintain a stability and normal performance of the electronic devices.

Generally a thermal module of an electronic device includes a heat pipe having one end attached to the processor and an opposite end attached to a fin unit to transfer heat of the processor to the fin unit, and a centrifugal blower for generating airflow to take away the heat of the fin unit. During assembly of the thermal module, several bolts are adopted to extend through the thermal module to engage with a circuit board on which the processor is arranged. Then a casing for installing the processor and the thermal module is closed. Thus when the thermal module needs to be replaced, the casing of the electronic device must be disassembled for taking the old thermal module away or putting a new thermal module into the casing, which is complicated and inconvenient.

For the foregoing reasons, therefore, there is a need in the art for an electronic device incorporating an extendable thermal module which overcomes the limitations described.

DETAILED DESCRIPTION

Figure 1:
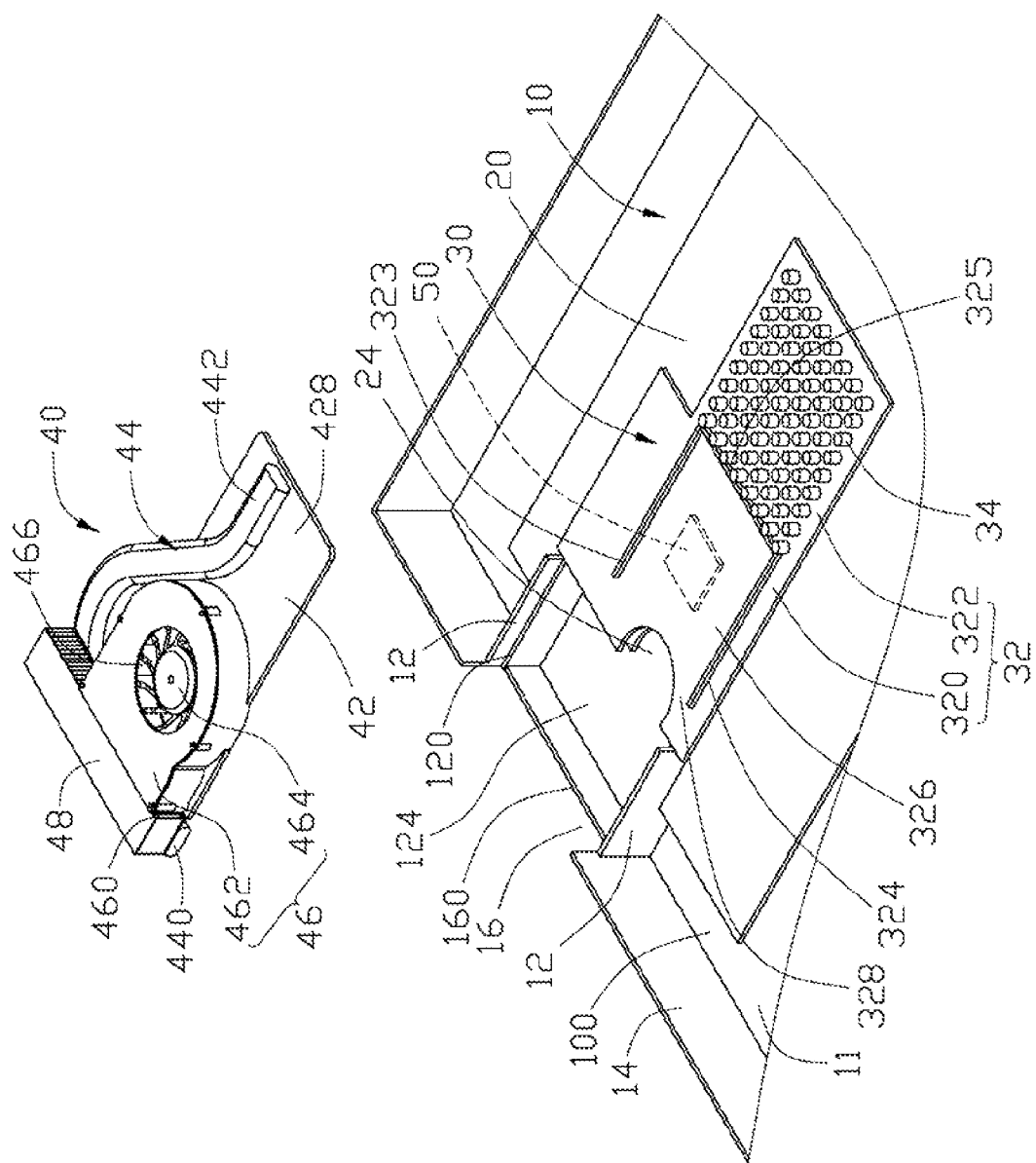
FIG. 1 is an isometric, exploded view of a part of an electronic device according to an exemplary embodiment.

Referring to FIG. 1, a part of a portable electronic device according to an exemplary embodiment is shown. The portable electronic device can be a notebook computer, or a portable DVD player, and includes a chassis 10, a circuit board 20, an electronic component 50, a heat sink 30, and a thermal module 40.

The chassis 10 includes a top plate (not shown), a bottom plate 11, and four side plates 14 between the top plate and the bottom plate 11. A space 100 is thus defined among the top plate, the bottom plate 11, and the side plates 14 for receiving the circuit board 20, the electronic component 50, the heat sink 30, and the thermal module 40 therein. In FIG. 1, the top plate of the chassis 10 which usually has a keypad or a keyboard thereon is removed for clearly showing the elements received in the chassis 10. In addition, a display panel of the electronic device, which is pivotably connected to the chassis 10, is not shown for simplifying the drawings.

Figure 3:
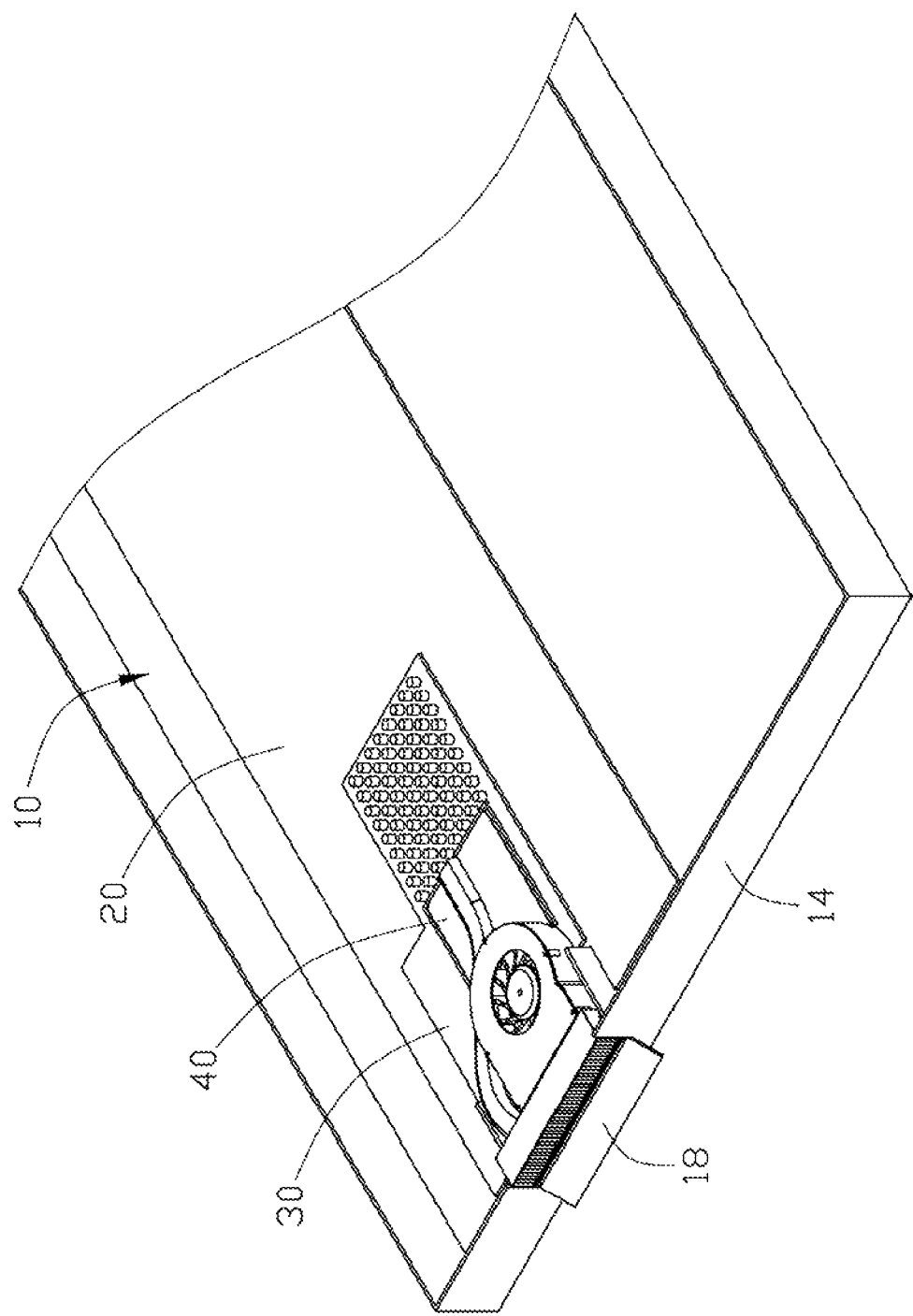
FIG. 3 is an assembled view of the part of the electronic device of FIG. 1, viewed from another aspect.

The bottom plate 11 of the chassis 10 is substantially rectangular. The side plates 14 are perpendicular to the bottom plate 11, and extend upwardly from four lateral sides of the bottom plate 11, respectively. The circuit board 20 is arranged on the bottom plate 11, and is substantially parallel to the bottom plate 11. The electronic component 50 is arranged on the circuit board 20, and is adjacent to a left side plate 14 of the chassis 10. A cutout 16 is defined in the left side plate 14, in line with and facing the electronic component 50. It is to be understood that the cutout 16 is formed according to a position of the electronic device 50, and can be formed in any side plate 14 which is adjacent to the electronic component 50. A depth of the cutout 16 substantially equals to a height of the thermal module 40, and a width of the cutout 16 in a front-to-rear direction substantially equals to that of the thermal module 40. Referring to FIG. 3, a covering plate 18 is formed on the left side plate 14, and can rotate relative to the left side plate 14 to seal the cutout 16 or open the cutout 16.

A pair of guiding plates 12 extend perpendicularly and inwardly from the left side plate 14 into the space 100 of the chassis 10. The guiding plates 12 connect with the left side plate 14 at front and rear sides of the cutout 16, respectively. Thus a passage 124 is defined between the pair of guiding plates 12 with a width equaling to that of the cutout 16. A top side (not labeled) of each guiding plate 12 is higher than a top side 160 of the left side plate 14 in the cutout 16. A rib 120 extend horizontally from each guiding plate 12 towards the other guiding plate 12. The ribs 120 each have a top side (not labeled) coplanar with the top side 160 of the left side plate 14 in the cutout 16. Therefore, the thermal module 40 can be inserted into the space 100 of the chassis 10 through the cutout 16 and then moved to the electronic component 50 along the guiding plates 12 and the ribs 120.

The heat sink 30 is made of aluminum or its alloy, and includes a flat base 32 and a plurality of pin fins 34. The base 32 includes a left part 320 arranged on the electronic component 50 and adjacent to the cutout 16, and a right part 322 away from the cutout 16. The plurality of pin fins 34 are distributed on the right part 322. The left part 320 has a size much larger than that of the electronic component 50 with a left side thereof abutting right sides of the guiding plates 12. A top surface 328 of the left part 320 of the base 32 of the heat sink 30 is coplanar with the top sides of the ribs 120 of the guiding plates 12. A semi-circular aperture 24 is defined in the left part 320 of the base 32, communicating with the passage 124. The aperture 24 is located between the guiding plates 12, and adjacent to a front one of the guiding plates 12.

Three bars, i.e., a first bar 323, a second bar 324 and a third bar 325, are formed on the top surface 328 of the left part 320 of the heat sink 30. The three bars 323, 324, 325 forms a U-shaped profile. The first bar 323 and the second bar 324 are parallel to each other. The third bar 325 is perpendicular to the first bar 323 and the second bar 324, and interconnects right ends of the first bar 323 and the second bar 324. Thus a chamber 326 is defined among the three bars 323, 324, 325 with a left side thereof facing and communicating the cutout 16 of the left side plate 14. The electronic component 50 is located under the chamber 326, and substantially at a middle of the chamber 326. The third bar 325 is adjacent to the pin fins 34, and left ends of the first bar 323 and the second bar 324 are adjacent to and spaced a distance from the left side of the left part 320 of the base 32 of the heat sink 30.

Figure 2:
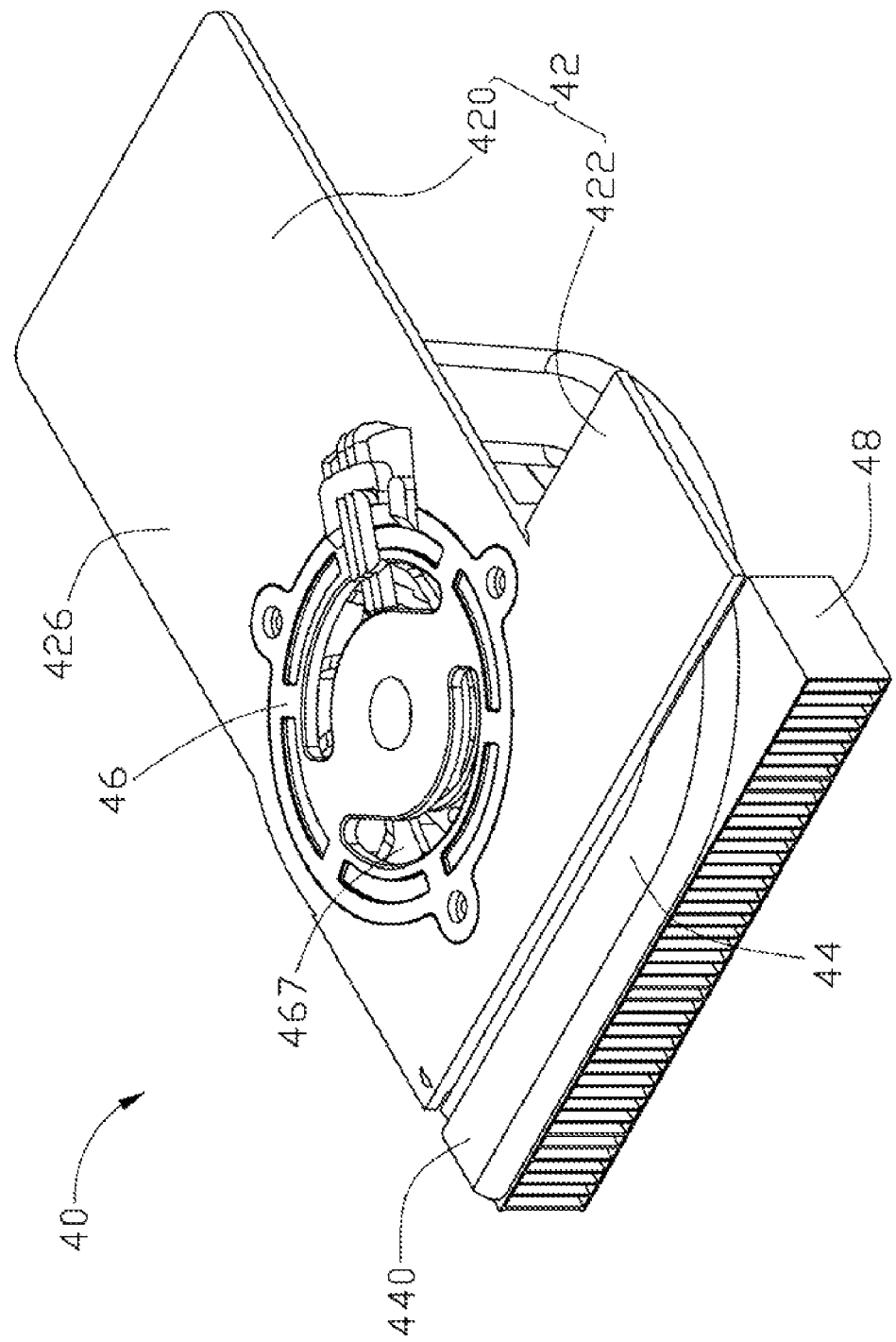
FIG. 2 shows a thermal module of the electronic device of FIG. 1 viewed from another aspect.

The thermal module 40 includes a mounting plate 42, a heat pipe 44, a blower 46 and a stacked fin unit 48. Referring to FIG. 2, the mounting plate 42 is substantially L-shaped, includes a narrow section 420 at a right end and a wide section 422 at a left end. A width of the narrow section 420 of the mounting plate 42 in the front-to-rear direction substantially equals to that of the chamber 326 of the heat sink 30, i.e., a distance between the first bar 323 and the second bar 324. A width of the wide section 422 of the mounting plate 42 in the front-to-rear direction substantially equals to that of the cutout 16 of the left side plate 14 of the chassis 10.

The blower 46 includes a housing 462 and an impeller 464 rotatably received in the housing 462. The housing 462 is arranged on the mounting plate 42 with a left side thereof aligned with a left side of the wide section 422 of the mounting plate 42. A circular first air inlet 466 is defined in a top side of the housing 462, and a circular hole extends through the mounting plate 42 and a bottom side of the housing 462 and functions as a second air inlet 467 of the blower 46. A rectangular air outlet 460 is defined at the left side of the housing 462 perpendicular to the first air inlet 466 and the second air inlet 467. The fin unit 48 is arranged adjacent to the air outlet 460 of the blower 46, and has a width in the front-to-rear direction equaling to that of the wide section 422 of the mounting plate 42. A length of the thermal module 40 in a left-to-right direction, i.e., a sum of lengths of the mounting plate 42 and the fin unit 48, is substantially the same as a distance between the left side plate 14 of the chassis 10 and the third bar 325 of the heat sink 30.

The heat pipe 44 has an evaporation section 442 and a condensation section 440 respectively formed at opposite ends thereof. The condensation section 440 is fixed to a bottom side of the fin unit 48. A bottom of the condensation section 440 of the heat pipe 44 is coplanar with a bottom surface 426 of the mounting plate 42. The evaporation section 442 extends to a right side of the blower 46. An end of the evaporation section 442 substantially aligns with a right side of the narrow section 420 of the mounting plate 42. The evaporation section 442 of the heat pipe 44 is fixed on a top surface 428 of the mounting plate 42. Thus, the components of the thermal module 40 are integrally connected together to be as a single unit.

When the operation status of the electronic component 50 of the electronic device is a low power consumption, the heat sink 30 on the electronic component 50 can satisfy the heat dissipation requirement of the electronic component 50. In such a situation, heat of the electronic component 50 is conducted to the base 32 and the pin fins 34 of the heat sink 30, and then dissipated to surrounding air. On the other hand, when the electronic component 50 operates at a status of high power consumption, the heat sink 30 can not satisfy the heat dissipation requirement; at this situation, the thermal module 40 can be inserted into the chassis 10 to help transfer of heat generated by the electronic component 50 to an outside.

To insert the thermal module 40 into the chassis 10, firstly, the right side of the narrow section 420 of the mounting plate 42 is aligned with the cutout 16 of the left side plate 14 of the chassis 10. Then the mounting plate 42 with the blower 46, the heat pipe 44 and the fin unit 48 is pushed rightward to move into the chassis 10. Since the top surface 328 of the left part 320 of the base 32, the top side of the ribs 120 of the guiding plate 12 and the top side 160 of the left side plate 14 in the cutout 16 are coplanar, the bottom surface 426 of the mounting plate 42 of the thermal module 40 can move along the ribs 120 to the left part 320 of the base 32 until the right side of the mounting plate 42 abuts the third bar 325 of the heat sink 30. As the length of the thermal module 40 equals to the distance between the left side plate 14 and the third bar 325 of the heat sink 30, the thermal module 40 can be completely inserted into the space 100. When the thermal module 40 is not in use, the covering plate 18 can be rotated to seal the cutout 16 to avoid dust or foreign articles into the chassis 10.

When the thermal module 40 is assembled into the chassis 10, the narrow portion of the mounting plate 42 is received in the chamber 326 defined between the three ribs 120, and engages the top surface 328 of the left part 320 of the base 32 tightly. The wide section 422 of the mounting plate 42 and the condensation section 440 of the heat pipe 44 are located between the guiding plates 12 and are supported by the ribs 120 of the guiding plates 12 since the wide section 422 of the mounting plate 42 of the thermal module 40 has the width thereof equaling to the distance between the guiding plates 12. Thus the thermal module 40 is completely and stably mounted into the chassis 10.

In such a situation, the evaporation section 442 of the heat pipe 44 on the narrow section 420 of the mounting plate 42 is located over the electronic component 50. The fin unit 48 and the condensation section 440 of the heat pipe 44 face the cutout 16 of the left side plate 14 of the chassis 10. The second air inlet 467 of the blower 46 aligns with the aperture 24 of the left part 320 of the base 32. An airflow generated by the blower 46 is driven from the surrounding air into the blower 46 through both of the first air inlet 466 and the second air inlet 467. The airflow leaves the cutout 16 vial the fin unit 48. Thus heat of the electronic component 50 can not only be dissipated by the pin fins 34 of the heat sink 30, but also can be taken away by the thermal module 40.

It is well known that heat absorbed by liquid having a phase change (i.e. from liquid to vapor) is hundred times more than that of the liquid without phase change, and a heat transfer efficiency by phase change of liquid is much better than heat conduction or heat convection without phase change. Thus the heat pipe 44 can absorb heat from the electronic component 50 and transfer the heat to the fin unit 48 quickly. Accordingly, the airflow of the blower 46 can take away the heat from the fin unit 48 quickly. The heat of the electronic component 50 can be removed timely. The electronic component 50 can thus work at a lower temperature even if the electronic component 50 operates at a mode of high power consumption.

As discussed above, the side plate 14 of the chassis 10 of the electronic device defines a cutout 16 corresponding to the electronic component 50 for inserting the thermal module 40 into the chassis 10. Apparently, the thermal module 40 can be taken away from the chassis via the cutout 16 easily when the thermal module 40 needs to be replaced or is not needed when the electronic component 50 works at a low power consumption. In this situation, the covering plate 18 is opened to expose the cutout 16, and thus the thermal module 40 can be taken out easily by pulling the thermal module 40 outwardly through the cutout 16. Therefore, the thermal module 40 of the present electronic device and the chassis 10 defining the cutout 16 in the side plate 14 of can be assembled or disassembled conveniently.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:
1. An electronic device, comprising:
 an electronic component;
 a chassis comprising a bottom plate and a side plate surrounding the bottom plate, a space being defined between the bottom plate and the side plate and receiving the electronic component therein;

a cutout being defined in the side plate facing the electronic component and adapted for mounting a thermal module onto the electronic component or taking out the thermal module from the electronic component;

a pair of guiding plates extending inwardly and perpendicularly from the side plate at opposite sides of the cutout respectively; and a pair of ribs, each rib of the pair of ribs extending from one of the pair of guiding plates towards the other one of the pair of guiding plates, wherein the each rib of the pair of ribs has a top side coplanar with a bottom of the cutout.

2. The electronic device of claim 1, further comprising a base arranged on the electronic component, a top surface of the base being coplanar with the top side of the each rib of the pair of ribs.

3. The electronic device of claim 2, wherein the base comprises one part over the electronic component and another part away from the electronic component and the cutout, a plurality of fins being formed on the another part.

4. The electronic device of claim 2, wherein three bars are formed on the base, the three bars forming a substantially U-shaped profile, a chamber being defined among the three bars with an open side facing the cutout, and the electronic component being located under the chamber.

5. The electronic device of claim 4, wherein a width of the chamber is smaller than that of the cutout, the thermal module comprising an L-shaped mounting plate, and the mounting plate comprising a narrow portion received in the chamber and a wide portion arranged on the top side of the each rib of the pair of ribs.

6. The electronic device of claim 5, wherein the thermal module further comprises a blower arranged on the mounting plate, an air inlet extending through the mounting plate for air flowing into the blower, and the base defining an aperture aligning with the air inlet of the blower.

7. The electronic device of claim 6, wherein the thermal module further comprises a fin unit arranged at an air outlet of the blower, and a heat pipe having a condensation section fixed to the fin unit and an evaporation section fixed on the narrow portion of the mounting plate.

8. The electronic device of claim 1, further comprising a covering plate rotatably connected to the side plate for sealing the cutout.

9. An electronic device, comprising:

a chassis comprising a bottom plate and a side plate surrounding the bottom plate, a cutout being defined in the side plate;

an electronic component arranged on the bottom plate and facing the cutout of the side plate;

a base arranged on the electronic component;

an extendable thermal module arranged on the base, wherein the thermal module is assembled onto the base through the cutout and can be taken out of the chassis through the cutout;

a pair of guiding plates extending inwardly and perpendicularly from the side plate at opposite sides of the cutout respectively; and a pair of ribs, each rib of the pair of ribs extending from one of the pair of guiding plates towards the other one of the pair of guiding plates, wherein the each rib of the pair of ribs has a top side coplanar with a bottom of the cutout.

10. The electronic device of claim 9, further comprising a covering plate rotatably connected to the side plate for sealing the cutout.

11. The electronic device of claim 9, wherein the base comprises a flat part over the electronic component and a rear part away from the electronic component and the cutout, a plurality of fins being formed on the rear part, and the thermal module being arranged on the flat part.

12. The electronic device of claim 11, wherein three bars are formed on the flat part of the base, the three bars forming a substantially U-shaped profile, a chamber being defined among the three bars with an open side facing the cutout, the electronic component being located under the chamber, and the thermal module being located in the chamber.

13. The electronic device of claim 12, wherein the thermal module comprises an L-shaped mounting plate, a blower arranged on the mounting plate and defining an air outlet facing the cutout, a fin unit arranged at the air outlet, and a heat pipe, the mounting plate comprising a narrow portion and a wide portion, the fin unit being adjacent to the wide portion, and the heat pipe comprising a condensation section fixed onto the fin unit and an evaporation section fixed on the narrow portion of the mounting plate.

14. The electronic device of claim 13, wherein a width of the chamber is smaller than that of the cutout, the narrow portion of the mounting plate is received in the chamber and the wide portion is arranged on the top side of the each rib of the pair of ribs.

15. An electronic device comprising:

an electronic component;

a chassis comprising a bottom plate and a side plate surrounding the bottom plate, a space being defined between the bottom plate and the side plate and receiving the electronic component therein, a cutout being defined in the side plate facing the electronic component;

a heat sink mounted on the electronic component to absorb heat generated by the electronic component;

a thermal module having a fin unit, an air blower for generating an airflow through the thermal module and a heat pipe having a condensing section connecting with the fin unit and an evaporating section;

a pair of guiding plates extending inwardly and perpendicularly from the side plate at opposite sides of the cutout respectively; and a pair of ribs, each rib of the pair of ribs extending from one of the pair of guiding plates towards to the other one of the pair of guiding plates, wherein the each rib of the pair of ribs has a top side coplanar with a bottom of the cutout;

wherein the thermal module is inserted into the space by extending through the cutout of the side plate, an inner part of the thermal module is located on the heat sink, and the evaporating section of the heat pipe is located over the electronic component.

16. the electonic device of claim 15, wherein the heat sink defines an aperture in line with an air inlet of the air blower.

17. The electronic device of claim 15, wherein the fin unit is located adjacent to the cutout.

18. The electronic device of claim 15, wherein a covering plate is rotatably connected to the side plate, the covering plate being rotatable to seal the cutout.

* * * * *